(12) United States Patent
Chen et al.

(10) Patent No.: US 6,716,736 B2
(45) Date of Patent: Apr. 6, 2004

(54) METHOD FOR MANUFACTURING AN UNDER-BUMP METALLURGY LAYER

(75) Inventors: Shih-Kuang Chen, Kaohsiung (TW); Chih-Hsiang Hsu, Pingtung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 10/043,174

(22) Filed: Jan. 14, 2002

(65) Prior Publication Data

US 2003/0104683 A1 Jun. 5, 2003

(51) Int. Cl.[7] .............................................. H01L 21/44
(52) U.S. Cl. .................. 438/612; 438/943; 438/945; 427/468; 427/272; 204/192.17
(58) Field of Search ................. 438/612, 943, 438/945; 134/26; 427/468, 272; 204/192.17

(56) References Cited

U.S. PATENT DOCUMENTS

| | | | | |
|---|---|---|---|---|
| 6,153,503 A | * | 11/2000 | Lin et al. | 438/613 |
| 6,426,281 B1 | * | 7/2002 | Lin et al. | 438/612 |
| 2002/0162579 A1 | * | 11/2002 | Wang et al. | 134/26 |

* cited by examiner

*Primary Examiner*—George Fourson
*Assistant Examiner*—Julio J. Maldonado
(74) *Attorney, Agent, or Firm*—Birch, Stewart, Kolasch & Birch, LLP

(57) ABSTRACT

In a method for manufacturing an under-bump metallurgy (UBM) layer, a plate having a plurality of openings is prepared. Then, the plate is placed on the wafer. Finally, the material of the under-bump metallurgy layer is sputtered on the wafer using the plate as a sputter mask so as to quickly form the under-bump metallurgy layer.

7 Claims, 2 Drawing Sheets

METHOD FOR MANUFACTURING AN UNDER-BUMP METALLURGY LAYER

BACKGROUND OF THE INVENTION

1. Field of the Invention

The invention relates to a method for manufacturing a semiconductor device, in particular to a method for manufacturing an under-bump metallurgy (UBM) layer of a semiconductor device.

2. Description of the Related Art

The numbers of I/O (Input/Output) on current silicon chips increase with the increase in the degree of integration and operation speed. The silicon chip package is developed from the original wire bonding technology to the flip-chip bonding technology.

In the flip-chip bonding technology, one of the most important processes is to form solder bumps on the bonding pads of the silicon chip. The material currently used for the bonding pads of the semiconductor is usually aluminum or copper. However, the solder in the solder bumps tends to react with the aluminum or copper. To solve this problem, it is possible to form an under-bump metallurgy layer on the bonding pads before the solder bumps are formed, so as to avoid the solid-solution reaction between the solder in the solder bumps and the aluminum or copper in the bonding pads, or to avoid the formation of the intermetallic compound. As described above, the under-bump metallurgy layer has to be well bonded to the solder bumps and the bonding pads, and functions as a diffusion barrier layer so as to prevent the solder bumps from reacting with the bonding pads. In addition, if the under-bump metallurgy layer reacts with the solder, it is necessary to lower the speed of reaction between the under-bump metallurgy layer and the solder, so as to prevent the under-bump metallurgy layer from being etched through. Consequently, the under-bump metallurgy layer is usually composed of a plurality of material layers so as to be well bonded to the solder bumps and the bonding pads, respectively, and to lower the speed of reaction between the under-bump metallurgy layer and the solder.

The conventional method for manufacturing the under-bump metallurgy layer includes defining by the photolithography process and forming the pattern of the under-bump metallurgy layer. The conventional method for manufacturing the under-bump metallurgy layer will be described in the following.

As shown in FIG. 1A, in the conventional method for manufacturing the under-bump metallurgy layer, a wafer 10 on which bonding pads 11 are formed is firstly provided. The bonding pads 11 may be composed of aluminum or copper. Then, an under-bump metallurgy layer 20 is formed on the wafer 10. The under-bump metallurgy layer 20 may be composed of a plurality of material layers. For example, the under-bump metallurgy layer 20 may include an adhesive layer 21, a barrier layer 22 and a wetting layer 23, respectively. Specifically, the function of the adhesive layer 21 is to enhance its adhesion to the bonding pads 11. The adhesive layer 21 is usually composed of a metallic material such as titanium, chromium, copper, aluminum, or a similar material. The barrier layer 22 is provided between the adhesive layer 21 and the wetting layer 23, and is usually composed of a material such as titanium, a titanium-tungsten compound, a nickel-vanadium compound, a chromium-copper compound, or a similar material. The wetting layer 23, which is usually composed of copper, can be bonded to the solder bumps, and can avoid the solid-solution reaction between the solder in the solder bumps and the aluminum or copper in the bonding pads, or the formation of the intermetallic compound.

As shown in FIG. 1B, a resist layer 30 is then formed on the under-bump metallurgy layer 20. Next, the resist layer 30 is exposed using a pre-designed pattern as a mask. Then, parts of the resist layer 30 are removed by the development with the developer.

As shown in FIG. 1C, the under-bump metallurgy layer 20 is etched using the remaining resist layer 30 as a mask. Finally, the remaining resist layer 30 is stripped. Thus, the under-bump metallurgy layer 20 having the required pattern can be formed on the wafer 10. Generally, the under-bump metallurgy layer 20 is formed on the bonding pads 11.

To sum up, in the conventional technology for manufacturing an under-bump metallurgy layer, a lot of processes (the photolithography process is the key process) have to be used. Therefore, it takes a lot of time and manufacturing costs, including the costs of manufacture machine, chemical material, and the like. In addition, the resist layer 30 and developer used in the above-mentioned process are almost all organic chemicals, which usually adversely affect the human body and the environment. Therefore, it is an important subject matter of the invention to provide a method for manufacturing the under-bump metallurgy layer with decreased steps and without using the resist layer and developer.

SUMMARY OF THE INVENTION

In view of the above-mentioned problems, it is therefore an object of the invention to provide a method for manufacturing an under-bump metallurgy layer capable of reducing the manufacturing steps.

Another object of the invention is to provide a method for manufacturing an under-bump metallurgy layer without using a photoresist and a developer.

To achieve the above-mentioned objects, a method of forming an under-bump metallurgy layer on a wafer includes: preparing a plate having a plurality of openings; placing the plate on the wafer; and sputtering the material of the under-bump metallurgy layer on the wafer using the plate as a sputter mask.

In this invention, the pattern of the openings is substantially identical to the pattern of the under-bump metallurgy layer formed on the wafer.

In addition, the under-bump metallurgy layer may include a plurality of metal layers. Therefore, a plurality of metal materials may be sputtered sequentially on the wafer with the plate as a sputter mask. In other words, the under-bump metallurgy layer can be composed of an adhesive layer, a barrier layer and a wetting layer in order.

As described above, since the plate serves as the sputter mask for forming the under-bump metallurgy layer in this invention, no resist layer formed by the photolithography process is needed. Thus, the manufacturing steps can be decreased, and the usage of the organic chemicals such as the photoresist, developer and the like can also be avoided.

DETAIL DESCRIPTION OF THE INVENTION

The method for manufacturing an under-bump metallurgy layer in accordance with a preferred embodiment of the invention will be described with reference to the accompanying drawings, wherein the same reference numbers denote the same elements.

Figure 1A:
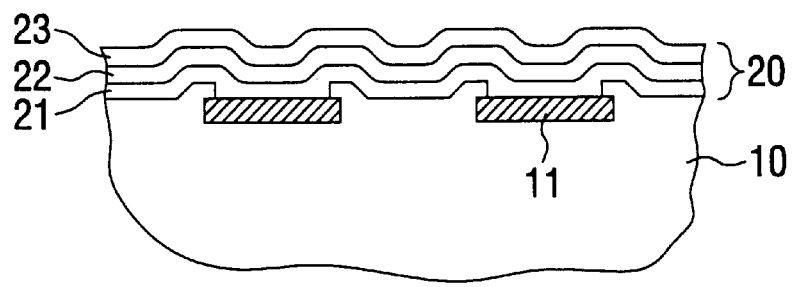
FIGS. 1A to 1C are schematic partial cross-sectional views showing a conventional method for forming an under-bump metallurgy layer on a wafer.
Figure 1B:
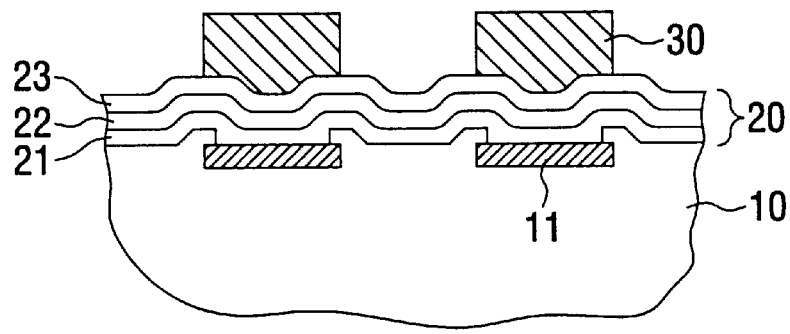
Figure 1C:
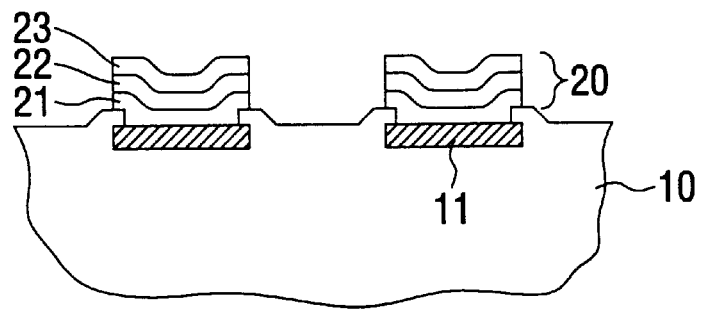
Figure 2A:
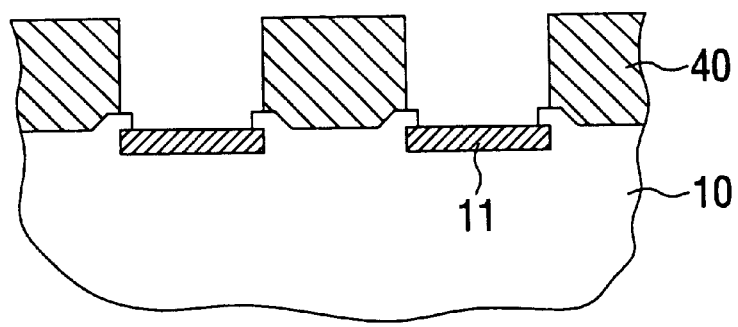
FIGS. 2A to 2C are schematically partial cross-sectional views showing a method in accordance with a preferred embodiment of the invention for forming an under-bump metallurgy layer on a wafer.

As shown in FIG. 2A, bonding pads 11, which may be composed of aluminum or copper, are formed on a wafer 10. First, a plate 40 that may be made of steel is provided on the wafer 10. In this embodiment, the plate 40 has a pre-designed pattern (not shown) of openings 42.

Figure 2B:
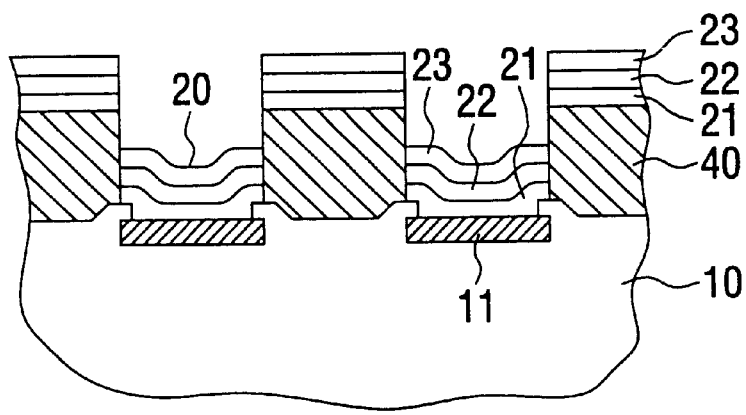

As shown in FIG. 2B, the material of an under-bump metallurgy layer 20 is sputtered on the wafer 10 using the plate 40 as a sputter mask, so as to form the under-bump metallurgy layer 20. In this embodiment, the pattern of the formed under-bump metallurgy layer 20 is identical to the pattern of the plate 40. That is, the pattern of the openings 42 is substantially identical to the pattern of the under-bump metallurgy layer 20. In other words, the scale of the pattern of the under-bump metallurgy layer 20 and that of the plate 40 is in the ratio of 1:1. In addition, a plurality of metals may be sequentially sputtered to form the under-bump metallurgy layer 20. For example, one of the metal materials such as titanium, chromium, copper, aluminum and the like may be sputtered to form an adhesive layer 21. Then, one of the materials such as titanium, a titanium-tungsten compound, a nickel-vanadium alloy, a chromium-copper alloy and the like may be sputtered to form a barrier layer 22. Finally, copper is sputtered to form a wetting layer 23. Therefore, the adhesive layer 21, barrier layer 22 and wetting layer 23 constitute the under-bump metallurgy layer 20.

Figure 2C:
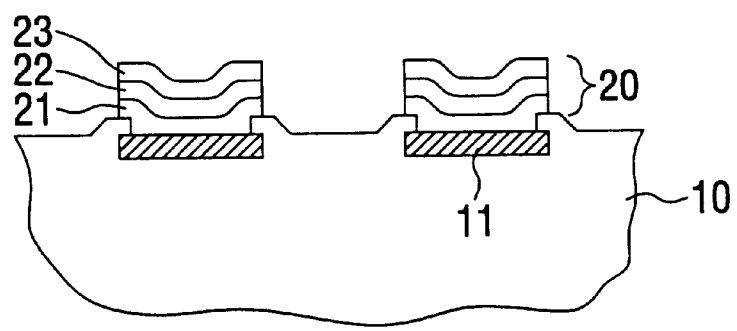

As shown in FIG. 2C, the plate 40 is then removed, and the formation of the under-bump metallurgy layer 20 on the wafer 10 is thus completed. As shown in this figure, the under-bump metallurgy layer 20 is usually formed on the bonding pads 11. Thus, it is possible to avoid the solid-solution reaction between the aluminum or copper in the bonding pads 11 and the solder in the solder bumps formed in the next process, or to avoid the formation of the intermetallic compound.

It should be noted that the plate 40 is not a conventional photo mask or a conventional resist layer having a pre-designed pattern. In this embodiment, the plate 40 is a steel plate on which the plurality of openings 42 is formed according to the pre-designed pattern. The thickness of the steel plate 40 is greater than that of the under-bump metallurgy layer 20. Thus, when the plate 40 is removed, it is possible to prevent the under-bump metallurgy layer 20 formed in the openings 42 from being damaged.

In addition, since the adhesive layer 21, barrier layer 22 and wetting layer 23 (as shown in FIG. 2B) that are sputtered on the plate 40 can be etched by the etching process, the plate 40 can be used repeatedly so as to save the manufacturing cost.

In summary, in the method for manufacturing the under-bump metallurgy layer of the preferred embodiment of the invention, instead of using the resist layer formed by the photolithography process as the mask, the plate 40 is directly placed on the wafer 10 as a sputter mask. Thus, the manufacturing steps of forming the resist layer can be decreased. In addition, the usage of the organic chemicals can be avoided. Thus, the adverse influence caused by the organic chemicals, which usually adversely affect the human body and the environment, can also be avoided.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A method of forming an under-bump metallurgy layer on a semiconductor wafer, comprising the steps of:

preparing a plate having a plurality of openings;

placing the plate on the semiconductor wafer;

sputtering the material of the under-bump metallurgy layer on the wafer and the plate simultaneously, wherein at least a first portion of the under-bump-metallurgy layer is formed on the plate and a second portion of the under-bump-metallurgy layer is formed on the semiconductor wafer; and removing the plate so that the second portion of the under-bump metallurgy layer is remained on the semiconductor wafer.

2. The method according to claim 1, wherein the pattern of the openings is substantially identical to the pattern of the under-bump metallurgy layer formed on the wafer.

3. The method according to claim 1, wherein the under-bump metallurgy layer comprises a plurality of metal layers.

4. The method according to claim 1, wherein the plate is made of steel.

5. The method according to claim 3, wherein the material of the metal layers comprises titanium.

6. The method according to claim 3, wherein the material of the metal layers comprises nickel-vanadium.

7. The method according to claim 3, wherein the material of the metal layers comprises copper.

* * * * *